United States Patent [19]
McElheny

[11] Patent Number: 6,038,171
[45] Date of Patent: Mar. 14, 2000

[54] FIELD EMISSION ERASABLE PROGRAMMABLE READ-ONLY MEMORY

[75] Inventor: Peter J. McElheny, Morgan Hill, Calif.

[73] Assignee: Altera Corporation, San Jose, Calif.

[21] Appl. No.: 08/953,849

[22] Filed: Oct. 15, 1997

Related U.S. Application Data

[60] Provisional application No. 60/041,195, Mar. 25, 1997.

[51] Int. Cl.[7] ..................................................... G11C 16/04
[52] U.S. Cl. ............... 365/185.14; 365/103; 365/185.29; 257/314
[58] Field of Search ....................... 365/185.14, 185.29, 365/218, 103, 174; 257/314, 316

[56] References Cited

U.S. PATENT DOCUMENTS

| | | | |
|---|---|---|---|
| 4,399,523 | 8/1983 | Gerber et al. ........................... | 365/103 |
| 4,910,565 | 3/1990 | Masuoka ................................. | 365/185 |
| 5,162,704 | 11/1992 | Kobori et al. ........................... | 315/349 |
| 5,350,937 | 9/1994 | Yamazaki et al. ....................... | 257/316 |
| 5,359,256 | 10/1994 | Gray ....................................... | 313/169 |

OTHER PUBLICATIONS

Hirano et al., "A MOSFET-structured Si Tip for Stable Emission Current", 1996, IEEE.

*Primary Examiner*—Son T. Dinh
*Attorney, Agent, or Firm*—Beyer & Weaver, LLP

[57] ABSTRACT

Disclosed is a field-emission erasable programmable read-only memory cell which includes one or more field-emission tips on one or more layers of the cell. The cell is programmable and/or erasable by electron emission from the emission tips. Methods of making and using this field-emission erasable programmable read-only memory (FEEPROM) cell are also provided.

33 Claims, 5 Drawing Sheets

FIELD EMISSION ERASABLE PROGRAMMABLE READ-ONLY MEMORY

This application claims the benefit of the filing date of Provisional application Ser. No. 60/041,195, filed Mar. 25, 1997.

BACKGROUND OF THE INVENTION

The present invention relates to nonvolatile semiconductor memory cells. More particularly, the invention relates to a nonvolatile memory cell which is programmable and/or erasable by field emission.

Conventional nonvolatile memory cells include EPROM, Flash and EEPROM cells. EPROM cells are electrically programmed by moving electrons onto the cells floating gate via hot electron injection, and optically erased (removing electrons from the floating gate) by exposure of the cell to UV radiation. EEPROM cells are both electrically programmed and electrically erased by moving electrons on and off the cell's floating gate via Fowler-Nordheim tunneling. Flash cells have elements of both EPROMs and EEPROMs: they are electrically programmed by hot electron injection and electrically erased by Fowler-Nordheim tunneling. Each of these memory cells have particular applications for which they are best suited.

EEPROM cells have the advantages that they need not be exposed to UV radiation for erasure, and they do not require the cell circuitry necessary for generating fields sufficient for hot electron injection. Therefore, EEPROMs are preferred in applications where these requirements would make it impractical or impossible to use an EPROM or FLASH cell.

FIGS. 1A shows a perspective view of a typical EEPROM cell. The cell 30 is a single polysilicon EEPROM cell. As such, it does not have a polysilicon control gate, but instead has a heavily doped diffusion region in the cell's substrate which is capacitively coupled to its floating gate. The cell 30 includes a single polysilicon floating gate structure 32 which performs three functions. At a first end, a tunnel extension 34 of floating gate 32 acts as an electrode in the two terminal device used for tunneling electrons from a heavily doped N+ implant 35 (also referred to as a programming Memory Diffusion or MD) through a tunnel oxide 36 (often about 80 Å thick) onto floating gate structure 32. At the other end of this floating gate, a wide area plate 38 is employed as one electrode of a capacitor enabling the floating gate 32 to be raised to a high voltage (e.g., about 6 to 11 volts) by capacitively coupling a programming voltage (e.g., about 9 to 13 volts) from a second electrode 40 (heavily doped N+ silicon, referred to herein as a control gate memory diffusion) through an oxide 42 (often about 180 Å thick). Between these two ends is a section of polysilicon that forms the gate 44 of a read transistor (N2).

The read transistor (N2) is connected in series with a word line transistor (N1) having a gate 46 forming part of a word line (also referred to as a row line) 31. The read and word line transistors separate a sense amp negative (−) input 48 (a source line) from a sense amp positive (+) input 50 (a drain line). Charging the floating gate 32 by tunneling electrons onto it (through tunnel oxide 36) raises the threshold voltage of the read transistor (EEPROM cell 30 is programmed). This shuts off the channel between the sense amp inputs, even when the adjacent word line transistor is turned on. Tunneling electrons off the floating gate 32 reduces the read transistor threshold voltage to negative values, effectively turning this device on (EEPROM cell 30 is erased). The word line transistor in series then controls the signal path between the two sense amp inputs 48 and 50.

The EEPROM cell is programmed or erased by charging or discharging, respectively, the floating gate 32. In order to tunnel electrons onto floating gate 32, a high voltage must be applied to the control gate memory diffusion 40. At the same time, the write column 56 is grounded and the write column transistor (N3) is turned on by, for example, selecting the row line 31 with, for example, 5 volts. The sense amp (−) input 48 can be biased from about 5 volts to a high voltage to assist tunneling electrons onto the floating gate 32. The voltage on the control gate memory diffusion 40 is capacitively coupled to the floating gate 32 as is the sense amp (−) input 48 voltage. The resulting positive voltage on floating gate 32 is sufficient to cause tunneling onto floating gate 32 through the tunnel oxide 36 where it intersects the floating gate (the tunnel oxide window 36a (shaded)), thereby programming the EEPROM cell 30.

In order to tunnel electrons off floating gate 32, a high voltage must be applied to memory diffusion 35 while ground is applied to the second heavily doped N+ implant (control gate memory diffusion) 40 which underlies and is capacitively coupled to the wide area plate 38. During this process, ground is also applied to sense amp (−) input 48. The application of high voltage to memory diffusion 35 is accomplished through a write column 56 and a write column select transistor (N3) including (i) a diffusion region 54 conductively connected to write column 56 for data input, (ii) a source/drain diffusion 58 electrically connected to memory diffusion 35, and (iii) a gate electrode 60, which is part of row line 31. When a sufficient potential is applied to the gate 60 of the write column select transistor through row line 31 while a write signal is applied through write column 56, electrons can tunnel off of the floating gate 32 to erase the EEPROM cell.

FIG. 1B provides additional detail on the structure of the programming and erasing portion of a typical conventional EEPROM cell 100. This cross-sectional side view shows a substrate 102, typically composed of silicon, which contains a memory diffusion region 103. Overlying the substrate 102 is a dielectric layer 104 (typically composed of a relatively thin tunnel window region within a relatively thicker field of gate oxide (not shown)). A floating gate 106, typically composed of polysilicon, overlies the dielectric layer 104. The floating gate 106 is capacitively coupled to a control gate 110 through an interlayer dielectric 108. The control gate memory diffusion (40, FIG. 1A) is not visible in this depiction of the cell.

A further description of a typical EEPROM cell and its functional elements is available the publication "EPM7032 Process, Assembly, and Reliability Information Package" available from Altera Corporation of San Jose Calif. That document is incorporated herein by reference for all purposes.

Despite the EEPROM's advantages, there are certain drawbacks to its use. For instance, the EEPROM tunnel dielectric window is subject to charge retention problems arising from stress-induced leakage current (SILC) through the tunnel dielectric caused by cycling of the cell. This current leakage through the tunnel window on or off the floating gate affects the reliability of the cell. Also, while the EEPROM does not require a voltage path sufficiently high for hot electron injection, as in EPROM and FLASH cells, the voltage necessary for Fowler-Nordheim tunneling requires a high voltage path relative to normal cell operating voltages. This high voltage path requirement has two effects. The first is that it complicates circuit design. The second is that in order to generate the voltage necessary for Fowler-Nordheim tunneling, a large area of the basic cell is required to couple the control gate voltage on to the floating gate.

The large voltage coupling area requirement in turn imposes limits on the minimum die size of any product that utilizes EEPROM. EEPROM cells have an additional limitation that impacts design shrinks: There is a limit to how thin an EEPROM tunnel dielectric can be scaled due to enhanced charge retention problems arising, both from increased SILC, as well as direct tunneling. Therefore, both voltage coupling and tunnel window requirements limit the extent to which EEPROMs can be scaled as device sizes decrease.

Further, EEPROM cells have relatively iona, programming and erasure times, typically of about 40 ms, depending upon charge density. As a result, EEPROM cells are generally unsuitable for disk storage memory applications.

Accordingly, there is a need for alternative nonvolatile memory devices without the limitations of a conventional EEPROM.

SUMMARY OF THE INVENTION

The present invention provides a field emission erasable programmable read only memory cell (FEEPROM) which includes one or more field-emission tips on one or more layers of the cell. The cell is programmable and/or erasable by electron emission from the emission tips. Such a cell provides an alternative to EEPROM cells in programmable logic devices and other applications where its scaleability, reliability, and program/erase speeds are advantageous.

In one aspect of the invention, a field emission erasable programmable read only memory cell includes a substrate, a floating gate separated from said substrate by a dielectric, and an erase gate separated from said floating gate by another dielectric. The substrate has a field-emission tip for programming (i.e., moving electrons onto the floatings gate) the cell by electron emission from the tip to the floating gate. The floating gate also has a field-emission tip for erasing (i.e., moving electrons off of the floating gate) said cell by electron emission from its tip to the erase gate.

The invention also provides a method of making a field emission erasable programmable read only memory cell. The method includes steps for making emission tips, including patterning a mask in a location on a substrate where a field emission tip is desired, subjecting the masked substrate to an isotropic etch process, and thermally oxidizing the etched substrate. The isotropic etch undercuts the mask to begin formation of a programming tip on the substrate, and the thermal oxidation further defines and sharpens the tip. The method may also be applied to the formation of an erase tip on a polysilicon floating gate.

FEEPROMs according to the present invention may be used in data processing systems. For example, a data processing system may include a processor, a memory, input/output circuitry, a field emission erasable programmable read only memory cell, and one or more peripheral devices. In the system, these components may be coupled together by a system bus and populated on a circuit board, and the circuit board may be contained in an enduser system.

These and other features and advantages of the invention will be described in more detail below with reference to the drawings.

DETAILED DESCRIPTION OF THE PREFERRED EMBODIMENTS

The present invention will be described with reference to a preferred embodiment. It will be understood by those skilled in the art that variations of the described method and apparatus may be made without departing from the scope of the present invention.

The present invention provides a field emission erasable programmable read-only memory (FEEPROM) cell. The FEEPROM cell is programmed and/or erased by moving electrons on or off a floating gate by field emission. In a preferred embodiment, the cell substrate and the floating gate each have one or more field-emission tips. The solid interlayer dielectric immediately adjacent to a field emission tip is replaced with a gas or vacuum in the preferred FEEPROMs of the present invention. Since very high fields can be created and focused on these tips, they are capable of providing relatively high currents for given voltage potential between the tip and the electrode to which it is emitting electrons. While the invention is described below with reference to a preferred embodiment which uses field-emission tips for both programming and erasure, FEEPROM cells in accordance with the present invention may also be hybrid devices, e.g., devices which are programmed by field-emission and erased by some other method, such as Fowler-Nordheim tunneling or hot electron injection, or vice versa.

Figure 1A:
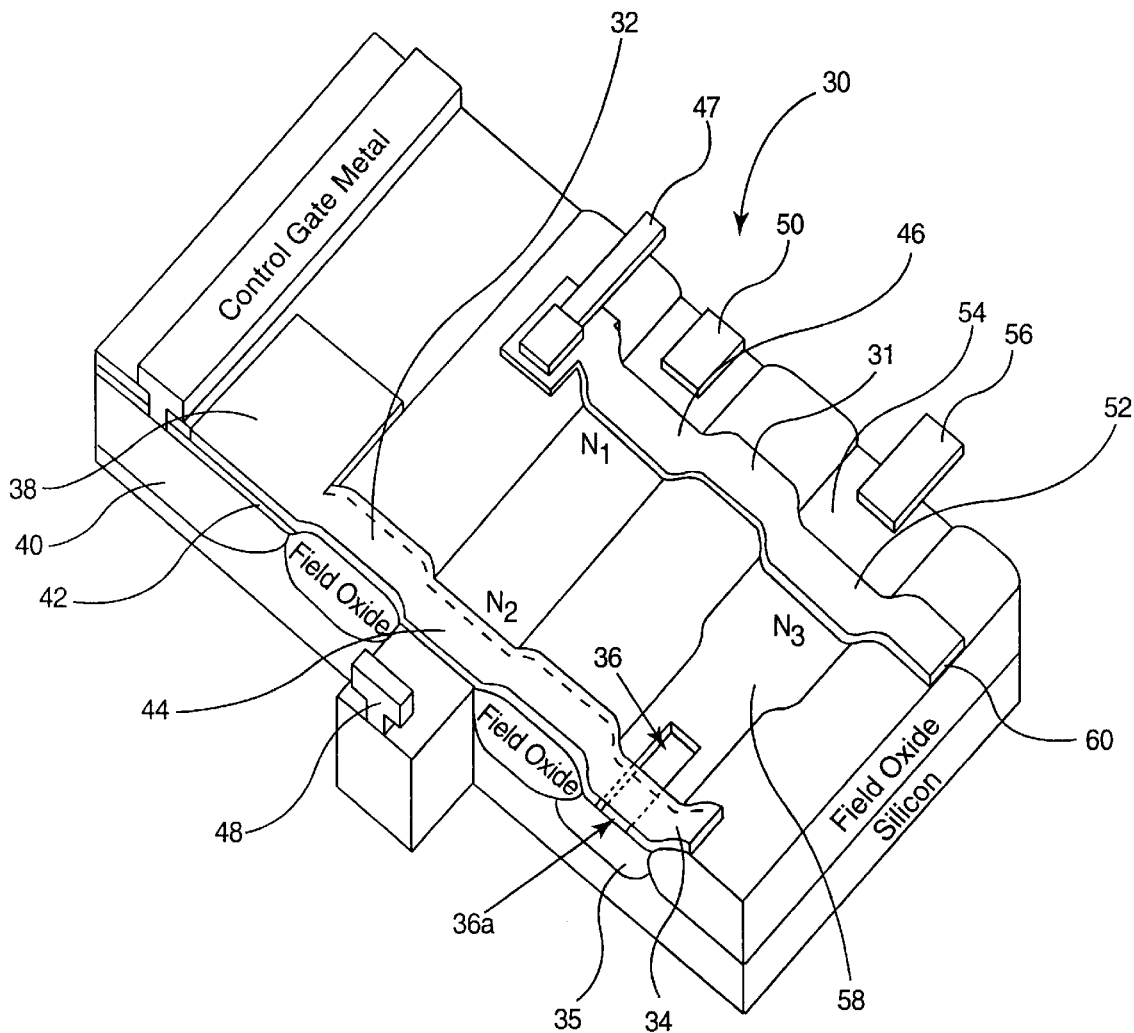
FIG. 1A is a cross-sectional perspective view of a single polysilicon EEPROM cell.
Figure 1B:
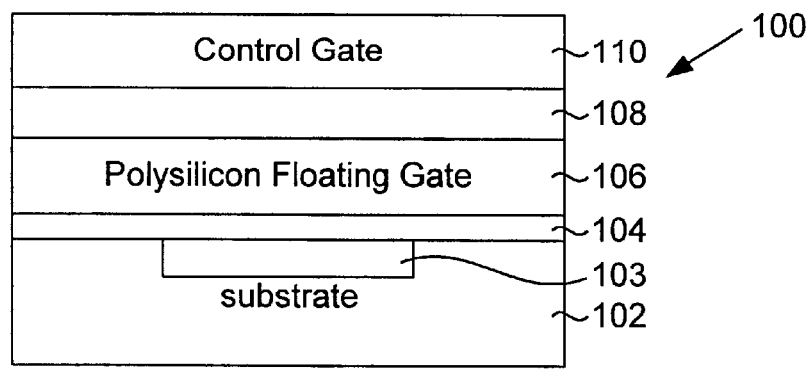
FIG. 1B is a cross-sectional side view of the programming and erase portion of a typical EEPROM cell.
Figure 2:
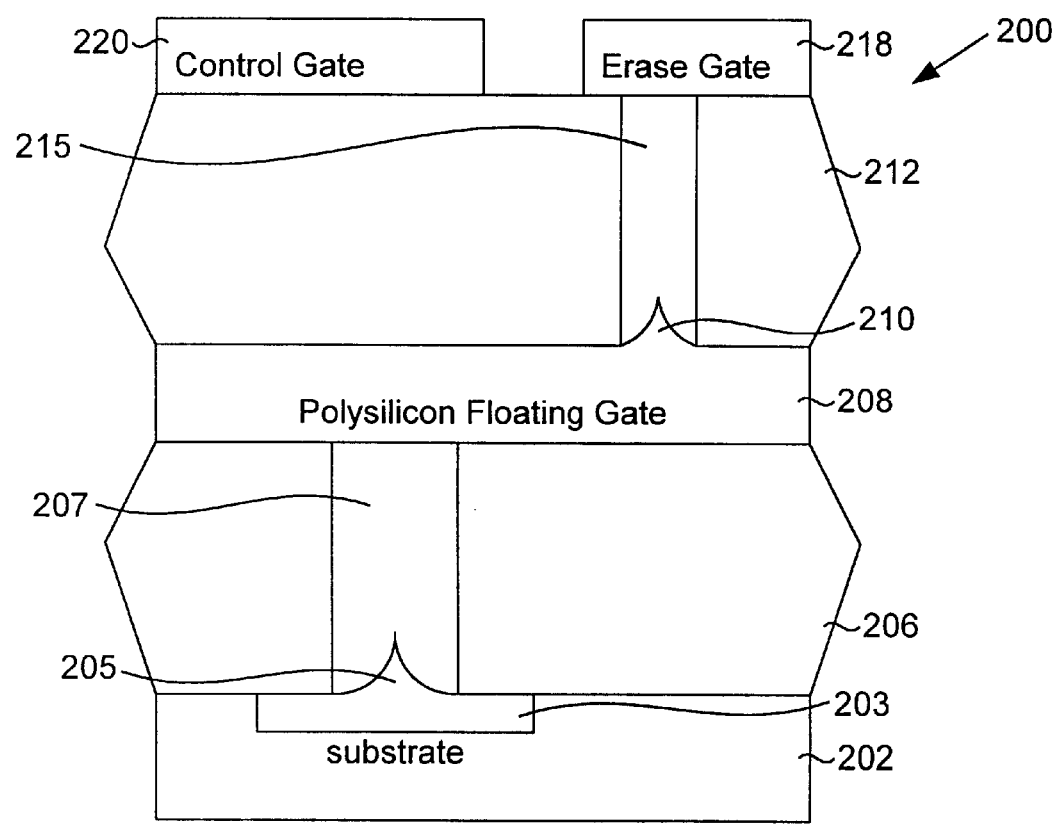
FIG. 2 is a cross-sectional side view of the basic programming and erasing portion of a preferred FEEPROM cell according to the present invention.

A preferred embodiment of the FEEPROM device 200 of the present invention is shown in FIG. 2. FEEPROM 200 includes a semiconductor substrate 202, typically composed of silicon. Within the substrate 202 is a n+ doped memory diffusion 203, typically formed by ion implantation, for example, of phosphorus or another suitable 5-valent element. Within the region of the memory diffusion 203 is a field-emission tip 205 ("the programming emission tip") for programming the FEEPROM by transmitting electrons to a floating gate 208. As will be described in more detail below, the memory diffusion 203 may be generated prior to or following the formation of programming emission tip 205.

Overlying the substrate 202 is a dielectric layer 206 ("the programming dielectric"). The programming dielectric 206 is composed of a suitable material and is of a suitable thickness to prevent electron transmission from the substrate to the floating gate 208 other than by electron emission from the field-emission tip 205, and to allow coupling between a control gate memory diffusion (not shown) in a region of the substrate outside the programming and erasing portion, and the floating gate 208. Suitable dielectric materials include borophosphosilicate glass (BPSG), thermally grown or CVD-deposited silicon dioxide ($SiO_2$), or spin-on glass (SOG). For a typical FEEPROM cell in a 0.35 µm device environment, the thickness of the dielectric will preferably be in the range of about 100 to 1000 Å, more preferably be in the range of about 250 to 750 Å, and most preferably about 500 Å. The thickness of the dielectric layer 206 may be varied between the programming region and the control gate coupling region in order to obtain the appropriate characteristics.

Within the programming dielectric 206 is a via hole 207 ("the programming via hole"). The programming via hole 207 overlies the programming emission tip 205, providing a path for electrons between the emission tip 205 and the floating gate 208. The via hole 207 may contain any material and have any conditions that allow electrons to flow from the emission tip to the floating gate at the appropriate fields for operation of the device. Preferably the via hole will contain a low pressure gas or vacuum. For example, the via hole may be maintained at a low air pressure, in the range of about $10^{-8}$ to $10^{-3}$ Torr, preferably in the range of about $10^{-7}$ to $10^{-4}$, most preferably about $10^{-6}$ Torr. In one particularly preferred embodiment of the present invention, the via hole is evacuated to create a vacuum between the tip 205 and the floating gate 208. In order to provide low pressure conditions within the via hole of the finished device, the atmosphere in which this stage of the fabrication is conducted should be maintained at the desired pressure until the via hole 207 is sealed by deposition of the next layer in the device structure. Appropriate via hole conditions are present in typical fabrication environments.

The via hole 207 is also preferably prepared for maintenance of the desired low pressure in the completed device, for example by deposition of a capping layer, such as Ti or TiN deposited by CVD or sputtering on the walls of the via hole 207 to keep impurities from entering the via hole atmosphere from the surrounding materials. Alternatively, the via hole could be subjected to a high temperature bake-off treatment, for example at a temperature of 400° C., in order to remove any volatile contaminants, such as solvents or hydrogen, from the walls of the via hole so that these do not later enter the via hole atmosphere and increase the pressure beyond a desirable level.

As previously noted, a floating gate 208 overlies the programming dielectric 206 and the programming via hole 207. The floating gate 208 is generally composed of polysilicon, but may also be formed of or contain other material or materials, including dopants, suitable for storing charge. Such materials are well known to those skilled in the art. Preferably, the floating gate 208 also has a field-emission tip 210 ("the erase emission tip"), oriented away from the substrate 202 and towards an erase gate 218. The erase gate 218 is separated from the floating gate 208 by a second dielectric layer 212 ("the erase dielectric") and a second via hole 210 ("the erase via hole"), in an arrangement similar to that between substrate 202 and floating gate 208. The erase gate 218 may be composed of any appropriate conductive material, and is preferably metal or polysilicon.

The erase emission tip 210 is used because emission tips only work (emit electrons) in one direction. Therefore, unlike an EEPROM which moves electrons on and off a floating gate through the same tunnel oxide window, a FEEPROM, according to this preferred embodiment, moves electrons onto the floating gate 208 from the substrate 202 by emission of electrons from the programming emission tip 205 through programming via hole 207. However, this electron flow cannot be reversed, since the concentrated field required for electron emission cannot be generated at a flat surface at field levels compatible with the normal operation of the device. Therefore, the erase emission tip 210 on the floating gate is used to move electrons off the floating gate. The erase gate 218 is provided in order to generate the field necessary to cause the emission tip 210 to emit electrons, removing them from the floating gate, and to receive the emitted electrons. This field may be generated by application of a positive voltage to the erase gate 218. In a preferred embodiment, the erase dielectric 212 should be designed to prevent coupling between the erase gate 218 and the floating gate 208 during erasure, so that the erase operation does not compete with a capacitive coupling attracting electrons to the floating gate, or otherwise affect the operation of the cell.

Control gate 220 is also provided in order to control the programming of the cell 200. In a "double poly" (that is, having two isolated gates (typically a floating gate and a control gate) of polysilicon or comparable material) device, the control gate 220 may be a separate layer of, for example, polysilicon, capacitively coupled to the floating gate 208 through the erase dielectric 212. In a preferred "single poly" (that is, having a single isolated gate (typically a floating gate) of polysilicon or comparable material) embodiment, the control gate may be a metallization layer overlying the erase memory diffusion 212 electrically connected to a control gate memory diffusion region in the cell substrate 202, which is in turn capacitively coupled to the floating gate 208 through the programming dielectric 206. In either case, the control gate 220 is used to provide the necessary field to cause programming tip 205 to emit electrons to program the cell.

While the preferred embodiment of the present invention described above in terms of field emission "tips," it should be understood that the field emission effect described by the present invention may occur at any localized region on a substrate, gate or other surface at which the concentrated field required for electron emission can be generated at field levels compatible with the normal operation of the device. Accordingly, the invention is not limited to the preferred emission "tip" embodiment, and the emission region make take other forms.

FEEPROM cells of the present invention may be designed such that the voltages required for programming and erasure are less than those required in EEPROM cells for a given current density. For example, voltages of preferably 1 to 10 V, more preferably 3 to 8 V, and most preferably 5 V may be used.

Figure 3A:
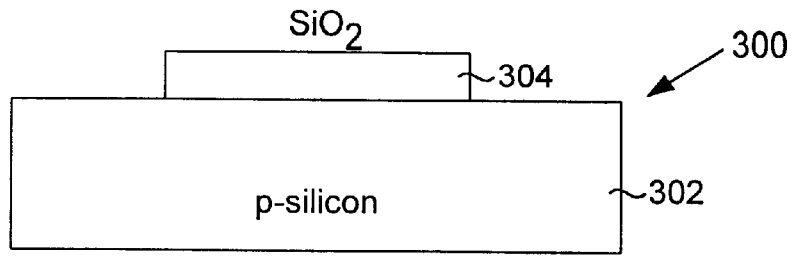
FIGS. 3A–H are cross-sectional side views of stages in the fabrication of a preferred FEEPROM cell according to the present invention.

FIGS. 3A–H depict various stages in the process of fabricating a preferred embodiment of an FEEPROM according to the present invention. Referring to FIG. 3A, a process layer stack 300 is shown. The layer stack 300 includes a substrate layer of p-silicon 302. The p-silicon substrate 302 may be produced by performing a p-type ion implant over a basic unmodified silicon substrate, penetrating an upper portion of the substrate (the "p-well portion"). In this operation, the p-type dopant is generally provided at a dose and energy sufficient to provide a very lightly doped well region (not shown). For example, this implant might be conducted with boron implanted at about $5 \times 10^{12}$ to $5 \times 10^{13}$ cm$^{-2}$ at an energy of between about 35 and 70 KeV. A subsequent diffusion anneal may then be conducted at a temperature and for a time sufficient to smooth out the p-type dopant concentration over well region to give a relatively uniform overall light p-doping level. The well formation conditions should be chosen such that the p-well region has a dopant concentration at the substrate surface (i.e., the channel region) of between about $2 \times 10^{16}$ and $1 \times 10^{17}$ cm$^{-3}$. It should be noted that, in many systems, the shape and extent of the p-well is defined by providing the semiconductor material with an ion implant mask of photoresist or other suitable masking material prior to ion implantation. Further alternative embodiments include silicon wafers cut from single crystal silicon grown with a specific dopant concentration, and growing a layer of silicon of the desired bulk concentration epitaxially on top of a substrate.

During fabrication of the device, the p-silicon substrate 302 will generally be doped with one or more appropriate 5-valent elements in order to create a n+ memory diffusion region. This doping may be conducted according to methods well known in the art. For example, an n-type ion implant may be performed over the substrate, penetrating the substrate's exposed p-well region to create a memory diffusion region underlying the substrate surface that has an n-type conductivity. A photoresist or other mask (not shown) may be provided leaving exposed only that area of the silicon substrate surface to be doped for the memory diffusion. In a preferred embodiment, the n-type dopants phosphorus and arsenic may be provided at doses of between about $1\times10^{14}$ to $1\times10^{15}$ and $7\times10^{14}$ to $7\times10^{15}$, respectively, at an energy of about 80 to 120 KeV and 60 to 80 KeV, respectively, which is sufficient to provide a highly doped memory diffusion region. This implant produces an n-type dopant concentration of about $1\times10^{18}$ to $1\times10^{20}$ cm$^{-3}$ in a memory diffusion region about 0.4 and 0.8 $\mu$m deep immediately under the substrate surface. Following this n-type ion implant step, the photoresist, if used, is removed.

This doping may be conducted either before or after the programming emission tip is formed. Further, some doping may be conducted both before and after tip formation. For example, an initial level of doping, such as that indicated above, may be provided for a memory diffusion region prior to tip formation, and a subsequent doping operation may be conducted to focus particular dopants, such as phosphorus or arsenic, in the emission tip following its formation. Similar considerations may apply with respect to the formation of the erase emission tip in the floating gate of a FEEPROM cell.

Referring again to FIG. 3A, an initial step in the process of forming an FEEPROM according to the present invention is patterning the substrate for the placement of the programming emission tip. In a preferred embodiment, a mask layer is deposited, or otherwise produced according to methods well known in the art, on the surface of the substrate in the location desired for the emission tip. Suitable masking materials include SiO$_2$ and Si$_3$N$_4$. In a preferred embodiment in a 0.35 cm device environment, the mask layer will preferably range in area from about 0.25×0.25 to 1.0×1.0 $\mu$m, more preferably from about 0.4×0.4 to 0.75×0.75 $\mu$m, and most preferably about 0.5 $\mu$m.

Following the placement of the mask 304, the layer stack 300 is then etched to commence formation of an emission tip underneath the mask 304. In a preferred embodiment, an isotropic etch is used to undercut the mask 304. Typical conditions for such etches are well known to those of skill in the art. For example, etching can be conducted using common wet etch techniques, including mixtures of nitric acid (HNO$_3$) and HF in an H$_2$O or CH$_3$COOH diluent. Additional etching, including anisotropic etching alone or in combination may also be used to assist in definition of an emission tip. For example, mixtures of KOH and isopropyl alcohol in an H$_2$O diluent, or reactive ion etching (RIE) with mixtures of CF$_4$ and O$_2$ may be used.

Figure 3B:
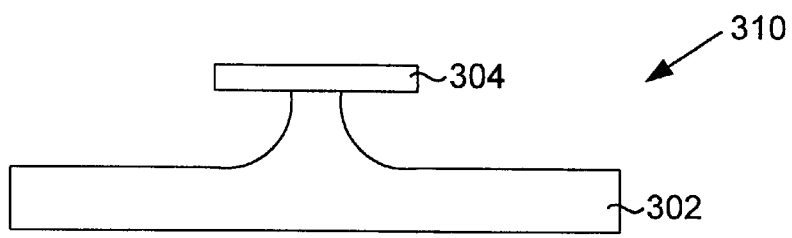
Figure 3C:
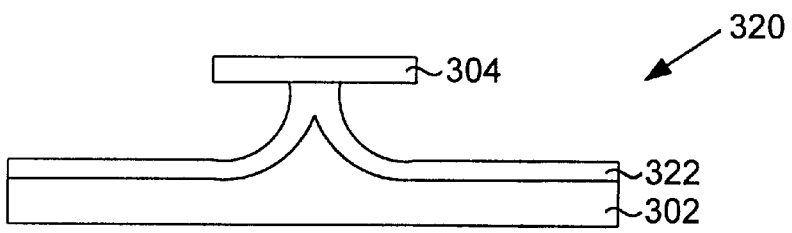
Figure 3D:
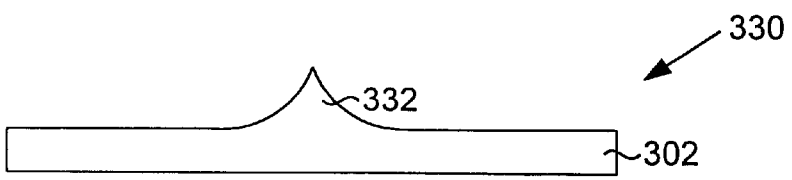

Turning to FIG. 3B, the layer stack 310 is depicted following such etching. The etch begins the formation of a programming emission tip on the substrate 302 by undercutting the mask. In order to enhance (sharpen) the shape of the tip, a thermal oxidation of the layer stack 310 is conducted. For example, the layer stack 310 is heated to 850 to 950° C. for about 15 minutes in a dry O$_2$/Cl atmosphere so that the bare silicon surface is converted to an oxide layer 322 of about 100 Å in thickness. If a thicker oxide thickness is required to make a sharp tip, other methods may be used as well, perhaps even by performing this oxidation at the same time as a local oxidation of silicon (LOCOS) step used to form a filed oxide, which is typically done with wet O$_2$ at a temperature of about 1000° C. for about 2 to 3 hours. FIG. 3C depicts the result of this thermal oxidation as layer stack 320. Referring to FIG. 3D, when this oxide layer 322, together with the mask layer 304 are removed, for instance by using a buffered HF etch, structure 330, including the form of an emission tip 332, remains.

Figure 3E:
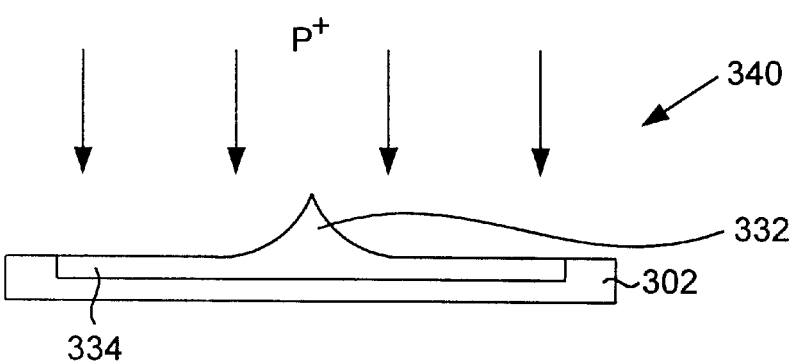

FIG. 3E shows that the processed substrate may then be doped by ion implantation of one or more appropriate 5-valent elements, such as phosphorus and/or arsenic, to generate a memory diffusion region 334 in the substrate, as shown in structure 340. Following ion implantation, the structure is generally annealed in order to repair any surface damage from the ion bombardment and electrically activate the implanted ions. Appropriate conditions for these operations are noted above with reference to FIG. 2. Also as previously noted, a special doping of just the tip 332 may also be conducted at this stage in order to provide particular emission characteristics to the tip. For example, in order to avoid undesirable coupling of the erase gate to the floating gate during erasure, the programming and erase tips could be designed and fabricated (doped) so that the erase tip is induced to emit electrons at a lower field than the programming tip. In a preferred embodiment, the erase emission tip could be more highly doped than the programming tip, therefore requiring smaller voltages for it to emit electrons. The range of dopant concentration in the emission tips is preferably within the ranges described in relation to the memory diffusion regions, above. The shape of the tip may also be a factor, with a sharper tip also requiring smaller voltages for electron emission. Such adjustment the field at which electron emission is initiated at the emission tips for other reasons related to the particular use to which a particular FEEPROM cell is put.

Once the substrate layer processing is complete, a dielectric layer 352 is produced over the substrate 302. As noted above, suitable dielectric materials include borophosphosilicate glass (BPSG), silicon dioxide (SiO$_2$), or spin-on glass (SOG). The thickness of the dielectric will preferably be in the range of about 100 to 1000 Å, more preferably be in the range of about 250 to 750 Å, and most preferably about 500 Å. The thickness of the dielectric layer 352 may be varied between the programming region and the control gate coupling region in order to obtain the appropriate characteristics. The dielectric may be applied by techniques well known in the art such as spinning, chemical vapor deposition (CVD), and thermal oxidation.

Figure 3F:
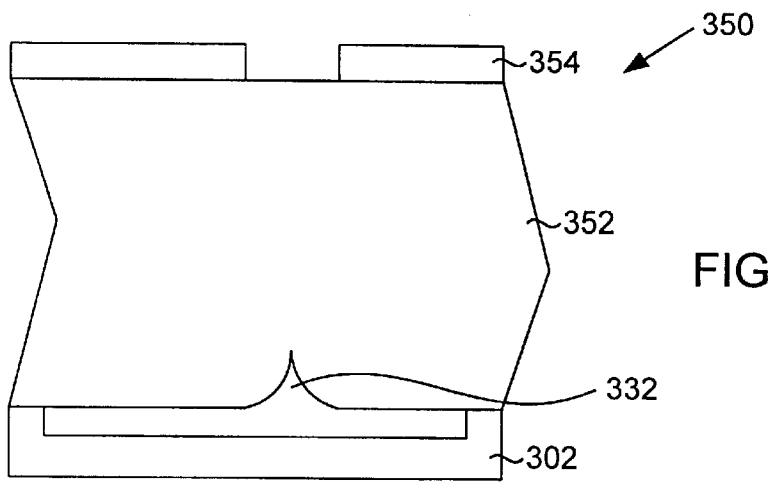
Figure 3G:
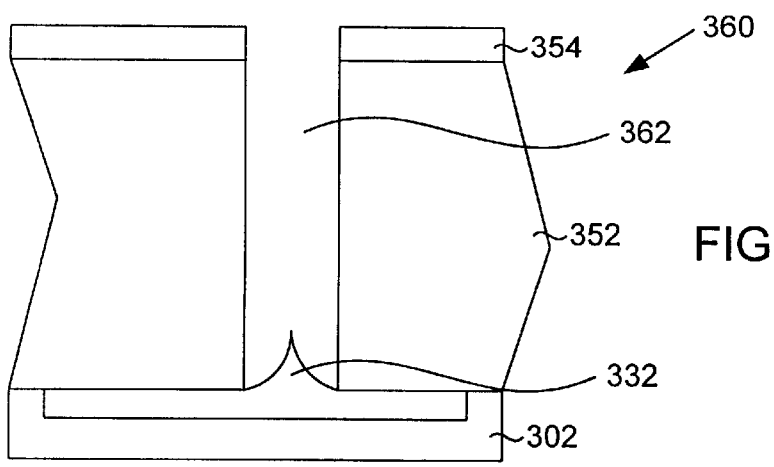

As shown in structure 350 in FIG. 3F, the surface of the dielectric 352 is then patterned with mask 354 for etching of the dielectric 352 for formation of a via hole 362. FIG. 3G depicts the layer structure 360 following anisotropic etching of the dielectric 352 to form the via hole 362. The etch is preferably conducted using an RIE etch that is highly selective to SiO$_2$, such as a mixture of CF$_4$ and H$_2$ in a range of proportions known to those of skill in the art. Consideration should be given to the relative fragility of the emission tip when these conditions are selected in order that it not be damaged during etching. In particular, as the partial pressure of H$_2$ is increased, the etch rate of Si decreases while the etch rate of SiO$_2$ remains relatively constant. Therefore, etch conditions with relatively high H$_2$ pressures within the operable range known to those of skill in the art should be selected so as to not adversely affect the shape of the emission tip 332.

Figure 3H:
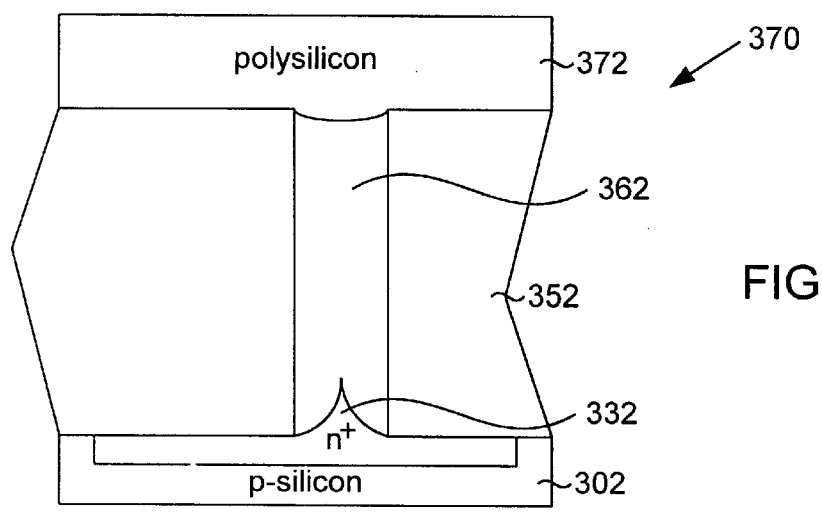

Following completion of the dielectric etch, a polysilicon floating gate layer 372 is generated over the dielectric layer 352 and the via hole 362. In order to form the floating gate, a blanket of polysilicon 360 is deposited over the dielectric surface by, for example, chemical vapor deposition. In order not to fill the via hole 362 with polysilicon, the polysilicon is applied to the layer stack 360 at an oblique angle of from about 45 to 65 degrees to the dielectric surface. In this way, the polysilicon will generally enter only slightly into the via hole 362, but will leave it substantially clear of polysilicon. The product of this step, structure 370, is shown in FIG. 3H.

The polysilicon deposited to form the floating gate should be thicker than desired in the final product in order to allow for formation of an erase field-emission tip in the same manner as the programming tip in the device substrate. Generally a thickness of approximately 1000 to 5000 Å in thickness is sufficient. Referring to FIG. 2, the erase tip 210, erase dielectric 212 and erase via hole 215 may then created according to the same procedures used for their programming counterparts, described above. As previously noted, different considerations relating to the strength of the field for electron emission to erase the floating gate 208 and the prevention of capacitive coupling between the erase gate 218 and the floating gate 208 during erasure operations, may govern the selection of the particular composition and thickness of the erase dielectric 212 and the doping of the erase tip 210. The dielectric thickness and dopant concentrations are preferably within about the same ranges of values provided for the programming portion of the cell, above.

To complete the preferred embodiment illustrated in FIG. 2, erase gate 218 and control gate 220 are applied overlying the erase dielectric 212 and erase via hole 215, and the erase dielectric 212, respectively. The erase gate 218 may be composed of metal, polysilicon or another appropriate charge propagating material. It may be applied, for example, by sputtering in the manner of the deposition of the floating gate 208, to avoid filling the erase via hole 215. The control gate 220 may be generated according to processes well known in the art, either for a "double poly" or a "single poly" implementation.

The FEEPROMs of the present invention may be used in a variety of applications, for instance as an alternative to the use of an EEPROM device as a PLD in a semiconductor application. FEEPROM cells may be particularly useful in multilevel cells (cells with multiple levels of storage capacity, beyond binary 0 and 1) where SILCs in EEPROM cells are a particular problem.

Figure 4:
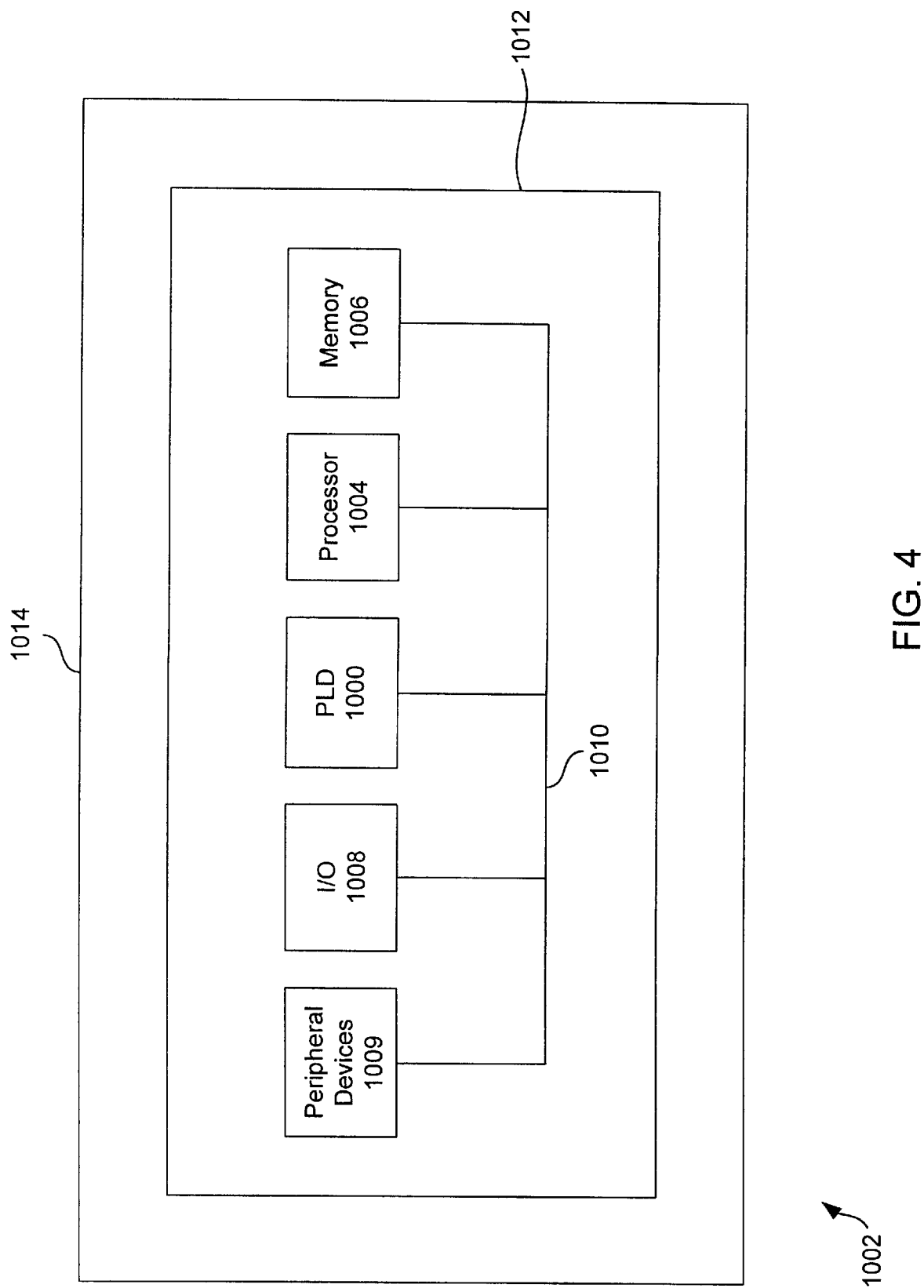
FIG. 4 illustrates a preferred implementation of a FEEPROM cell according to the present invention as a PLD in a data processing system.

FIG. 4 illustrates one general application of the FEEPROM of the present invention as part of a PLD 1000 in a data processing system 1002. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

Although specific embodiments of the present invention has been described in detail, it should be understood that the present invention may be embodied in many other specific forms without departing from the spirit or scope of the invention as recited in the claims.

What is claimed is:

1. A field emission erasable programmable read only memory cell, comprising:

one or more field-emission tips on one or more layers of said cell, said cell being programmable and/or erasable by electron emission from one or more of said emission tips.

2. The cell of claim 1, wherein at least one of said emission tips is on a substrate layer of the cell.

3. The cell of claim 1, wherein at least one of said emission tips is on a floating gate layer of said cell.

4. The cell of claim 1, wherein said layers comprise a substrate, a floating gate, and erase gate.

5. The cell of claim 4, wherein said substrate layer is separated from said floating gate layer by a layer of dielectric, and said floating gate layer is separated from said erase gate layer by a second dielectric layer.

6. The cell of claim 5, wherein said field emission tips are present on said substrate layer and on said floating gate layer.

7. The cell of claim 6, wherein said first and second dielectric layers each comprise a via hole, a first via hole being interposed between the field emission tip on said substrate layer and said floating gate layer, and a second via hole being interposed between said second field emission tip on said floating gate layer and said erase gate layer.

8. The cell of claim 7, wherein said via holes contain a gas or a vacuum.

9. The cell of claim 8, wherein said gas is at a pressure in the range of about $10^{-8}$ to $10^{-3}$ Torr.

10. The cell of claim 9, wherein said gas is at a pressure of about $10^{-4}$ Torr.

11. The cell of claim 4, wherein said cell further comprises a control gate.

12. The cell of claim 11, wherein said control gate is a metallization layer electrically connected to a control gate memory diffusion region in said substrate.

13. A field emission erasable programmable read only memory cell, comprising:

a substrate;

a floating gate separated from said substrate by a dielectric;

an erase gate separated from said floating gate by a second dielectric;

a field-emission tip on said substrate for programming said cell by electron emission from said tip to said floating gate; and a second field-emission tip on said floating gate for erasing said cell by electron emission from said second tip to said erase gate.

14. The cell of claim 13, wherein said first and second dielectrics each comprise a via hole, a first via hole being interposed between the field emission tip on said substrate and said floating gate, and a second via hole being interposed between said second field emission tip on said floating gate and said erase gate.

15. The cell of claim 14, wherein said via holes contain a gas or a vacuum.

16. The cell of claim 15, wherein said gas is at a pressure in the range of about $10^{-8}$ to $10^{-3}$ Torr.

17. The cell of claim 16, wherein said gas is at a pressure of about $10^{-4}$ Torr.

18. The cell of claim 13, wherein said cell further comprises a control gate.

19. The cell of claim 18, wherein said control gate is a metallization layer electrically connected to a control gate memory diffusion region in said substrate.

20. The cell of claim 13, wherein said first and second field-emission tips are both within doped diffusion regions in said substrate and said floating gate.

21. The cell of claim 13, wherein said second field-emission tip has a higher dopant concentration than said first field emission tip.

22. The cell of claim 13, wherein said second dielectric layer is thinner than said first dielectric layer.

23. The cell of claim 13 wherein the voltages required for programming and erasure of said cell are in the range of about 1 to 10 V.

24. The cell of claim 23 wherein the voltages required for programming and erasure of said cell are in the range of about 3 to 8 V.

25. The cell of claim 13 wherein the voltage required for programming and erasure of said cell is about 5 V.

26. The cell of claim 13, wherein said cell is programmed by transmitting electrons from the substrate of said cell to the floating gate of said cell by electron emission from the field-emission tip on said substrate.

27. The cell of claim 26, wherein said cell is erased by transmitting electrons from the floating gate of said cell to the erase gate of said cell by electron emission from the field-emission tip on said floating gate.

28. The cell of claim 27, wherein said electron transmission is conducted through via holes in dielectric layers separating said substrate from said floating gate, and said floating gate from said erase gate.

29. The cell of claim 28, wherein said via holes contain a gas or a vacuum.

30. The cell of claim 29, wherein said gas is at a pressure in the range of about $10^{-8}$ to $10^{-3}$ Torr.

31. The cell of claim 30, wherein said gas is at a pressure of about $10^{-4}$ Torr.

32. A data processing system, comprising:

a processor;

a memory;

input/output circuitry;

a field emission erasable programmable read only memory cell, including one or more field-emission tips on one or more layers of said cell, said cell being programmable and/or erasable by electron emission from one or more of said emission tips; and one or more peripheral devices;

said components being of coupled together by a system bus and populated on a circuit board, said circuit board being, contained in an end-user system.

33. A nonvolatile memory having multiple levels of storage capacity, said memory comprising one or more field emission erasable programmable read only memory cells, wherein said one or more field emission erasable programmable read only memory cells include one or more field-emission tips on one or more layers of said cell.

* * * * *

UNITED STATES PATENT AND TRADEMARK OFFICE
CERTIFICATE OF CORRECTION

PATENT NO.   : 6,038,171
DATED        : March 14, 2000
INVENTOR(S)  : Peter J. McElheny It is certified that error appears in the above-identified patent and that said Letters Patent is hereby corrected as shown below:

Column 12 line 23, please replace "being of" with --being--.

Column 12 line 24, please replace "being," with --being--.

Signed and Sealed this

Fifth Day of June, 2001

*Attest:*

*Attesting Officer*

NICHOLAS P. GODICI

*Acting Director of the United States Patent and Trademark Office*